(12) United States Patent
Adachi et al.

(10) Patent No.: US 10,249,518 B2
(45) Date of Patent: Apr. 2, 2019

(54) POLISHING DEVICE AND POLISHING METHOD

(71) Applicant: Toshiba Memory Corporation, Minato-ku (JP)

(72) Inventors: Masayoshi Adachi, Yokkaichi (JP); Jun Takayasu, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 33 days.

(21) Appl. No.: 14/844,214

(22) Filed: Sep. 3, 2015

(65) Prior Publication Data

US 2016/0260625 A1 Sep. 8, 2016

Related U.S. Application Data

(60) Provisional application No. 62/128,364, filed on Mar. 4, 2015.

(51) Int. Cl.
| | |
|---|---|
| *H01L 21/67* | (2006.01) |
| *H01L 21/02* | (2006.01) |
| *B24B 49/00* | (2012.01) |
| *B24B 21/00* | (2006.01) |
| *B24B 49/12* | (2006.01) |
| *H01L 21/66* | (2006.01) |

(52) U.S. Cl.
CPC ...... *H01L 21/67092* (2013.01); *B24B 21/002* (2013.01); *B24B 49/003* (2013.01); *B24B 49/12* (2013.01); *H01L 21/02035* (2013.01); *H01L 21/02087* (2013.01); *H01L 21/67219* (2013.01); *H01L 22/12* (2013.01); *H01L 22/26* (2013.01)

(58) Field of Classification Search
CPC ......... H01L 21/02035; H01L 21/02087; H01L 21/67092; H01L 21/67219; H01L 22/12; H01L 22/26; B24B 21/002; B24B 49/003; B24B 49/12
See application file for complete search history.

(56) References Cited

U.S. PATENT DOCUMENTS

| | | | |
|---|---|---|---|
| 8,771,038 B2 | 7/2014 | Kimba et al. | |
| 2003/0030795 A1* | 2/2003 | Swan | G01N 21/9506 356/237.4 |
| 2004/0106363 A1* | 6/2004 | Ishii | B24B 21/002 451/65 |
| 2004/0169869 A1* | 9/2004 | Shin | G01N 21/9501 356/635 |

(Continued)

FOREIGN PATENT DOCUMENTS

| | | |
|---|---|---|
| JP | H07-276229 A | 10/1995 |
| JP | 2004-031756 | 1/2004 |

(Continued)

*Primary Examiner* — Marc Carlson
(74) *Attorney, Agent, or Firm* — Oblon, McClelland, Maier & Neustadt, L.L.P.

(57) ABSTRACT

According to one embodiment, a polishing device includes a stage holding a wafer, a polishing part polishing a film formed on a circumferential edge portion of the wafer, a detector detecting a residual portion of the film on the circumferential edge portion, a first movable part moving the detector along a surface of the circumferential edge portion; and a controller controlling the polishing part based on a state of the circumferential edge portion detected by the detector.

11 Claims, 15 Drawing Sheets

(56) References Cited

U.S. PATENT DOCUMENTS

| | | | |
|---|---|---|---|
| 2007/0238393 A1* | 10/2007 | Shin | B24B 9/065 451/5 |
| 2008/0200100 A1* | 8/2008 | Takahashi | B24B 9/065 451/44 |
| 2008/0274670 A1* | 11/2008 | Tada | B24B 9/065 451/6 |
| 2009/0093192 A1* | 4/2009 | Takahashi | B24B 21/16 451/6 |
| 2009/0117828 A1* | 5/2009 | Hongo | B24B 9/065 451/6 |
| 2009/0262353 A1* | 10/2009 | Benvegnu | B24B 37/013 356/433 |
| 2011/0207294 A1* | 8/2011 | Nakanishi | B24B 9/065 438/459 |

FOREIGN PATENT DOCUMENTS

| | | |
|---|---|---|
| JP | 2005-191179 | 7/2005 |
| JP | 2006-294969 A | 10/2006 |
| JP | 2008-500907 A | 1/2008 |
| JP | 2008-298696 A | 12/2008 |

\* cited by examiner

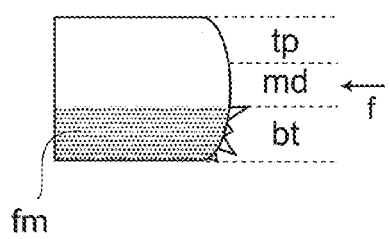
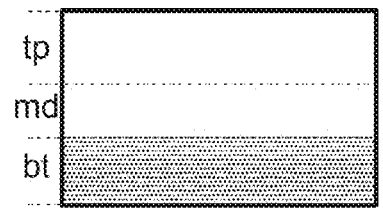
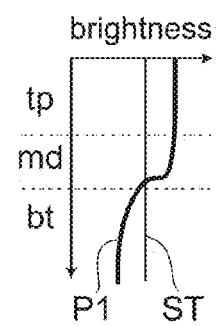
FIG. 8A          FIG. 8B          FIG. 8C
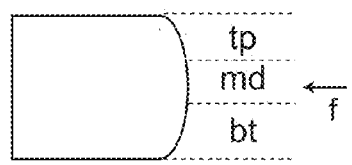
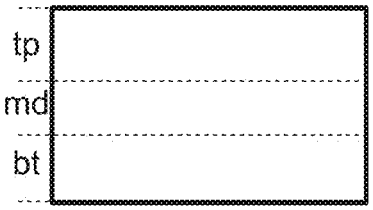
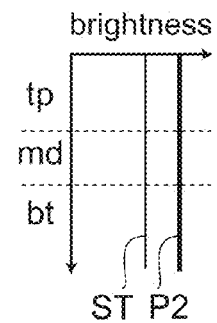
FIG. 8D          FIG. 8E          FIG. 8F

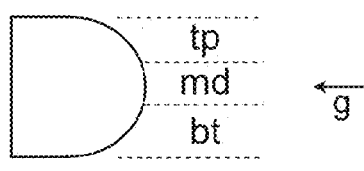 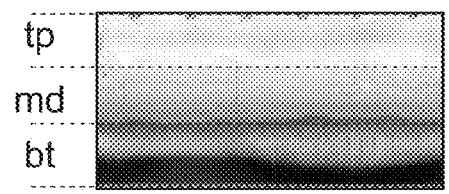
FIG. 9A  FIG. 9B
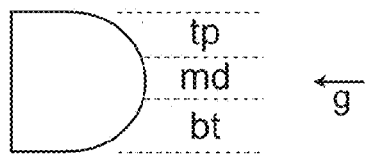 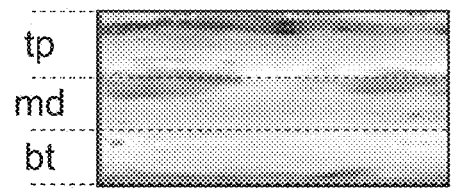
FIG. 9C  FIG. 9D

POLISHING DEVICE AND POLISHING METHOD

CROSS-REFERENCE TO RELATED APPLICATION

This application is based upon and claims the benefit of priority from U.S. Provisional Patent Application 62/128,364, filed on Mar. 4, 2015; the entire contents of which are incorporated herein by reference.

FIELD

Embodiments described herein relate generally to a polishing device and a polishing method.

BACKGROUND

In the manufacturing process of semiconductor devices, large amounts of material are deposited onto wafers. In the course of depositing large amounts of material onto a wafer, the material is also deposited onto a bevel portion which is the circumferential edge portion of the wafer. It is not necessary for the semiconductor devices to have such a film deposited onto the bevel portion. In addition, in the course of the manufacturing process, the film deposited onto the bevel portion of the wafer may be peeled off and may contaminate the surface of the wafer. In such a case, the product yield is decreased. For this reason, the film deposited onto the bevel portion is removed by a process such as polishing.

BRIEF DESCRIPTION OF THE DRAWINGS

FIG. 8A is a schematic view illustrating the circumferential edge portion of the wafer on which the film remains, FIG. 8B is a diagram schematically showing a photo of the circumferential edge portion of the wafer illustrated in FIG. 8A imaged by a camera of the detector, FIG. 8C is a graph showing the distribution of the brightness in the circumferential edge portion with the brightness on the horizontal axis and the position on the circumferential edge portion on the vertical axis, FIG. 8D is a schematic view illustrating the circumferential edge portion of the wafer after the re-polishing process, FIG. 8E is a diagram schematically showing a photo of the circumferential edge portion of the wafer illustrated in FIG. 8D imaged by a camera of the detector, and FIG. 8F is a graph showing the distribution of the brightness in the circumferential edge portion after the re-polishing process with the brightness on the horizontal axis and the position on the circumferential edge portion on the vertical axis;

FIG. 9A is a photo of the circumferential edge portion of the wafer on which the film remains, FIG. 9B is a photo of the circumferential edge portion of the wafer shown in FIG. 9A imaged by the camera of the detector, FIG. 9C is a photo of the circumferential edge portion of the wafer imaged after the residual portion of the film was selectively polished, and FIG. 9D is a photo of the circumferential edge portion of the wafer shown in FIG. 9C imaged by the camera of the detector;

FIG. 10A is a graph showing the distribution of the brightness of the wafer before the additional polishing process, and FIG. 10B is a graph showing the distribution of the brightness of the wafer after the additional polishing process;

DETAILED DESCRIPTION

According to one embodiment, a polishing device includes a stage holding a wafer, a polishing part polishing a film formed on a circumferential edge portion of the wafer, a detector detecting a residual portion of the film on the circumferential edge portion, a first movable part moving the detector along a surface of the circumferential edge portion; and a controller controlling the polishing part based on a state of the circumferential edge portion detected by the detector.

Various embodiments will be described hereinafter with reference to the accompanying drawings.

(First Embodiment)

First, a first embodiment will be described.

In general, when a large amount of material is deposited onto the major surface of a wafer, the materials are also formed into a film on the circumferential edge portion of the wafer. In addition, even in a case where the film formed on the major surface of the wafer is processed, deposited matter generated in the processing becomes a portion of the film at the circumferential edge portion of the wafer. There is a possibility that the film formed on the circumferential edge portion of the wafer in this manner will contaminate the top of the major surface of the wafer. For this reason, the film formed on the circumferential edge portion of the wafer after depositing the material onto the wafer may be removed by polishing using a polishing device.

Figure 1:
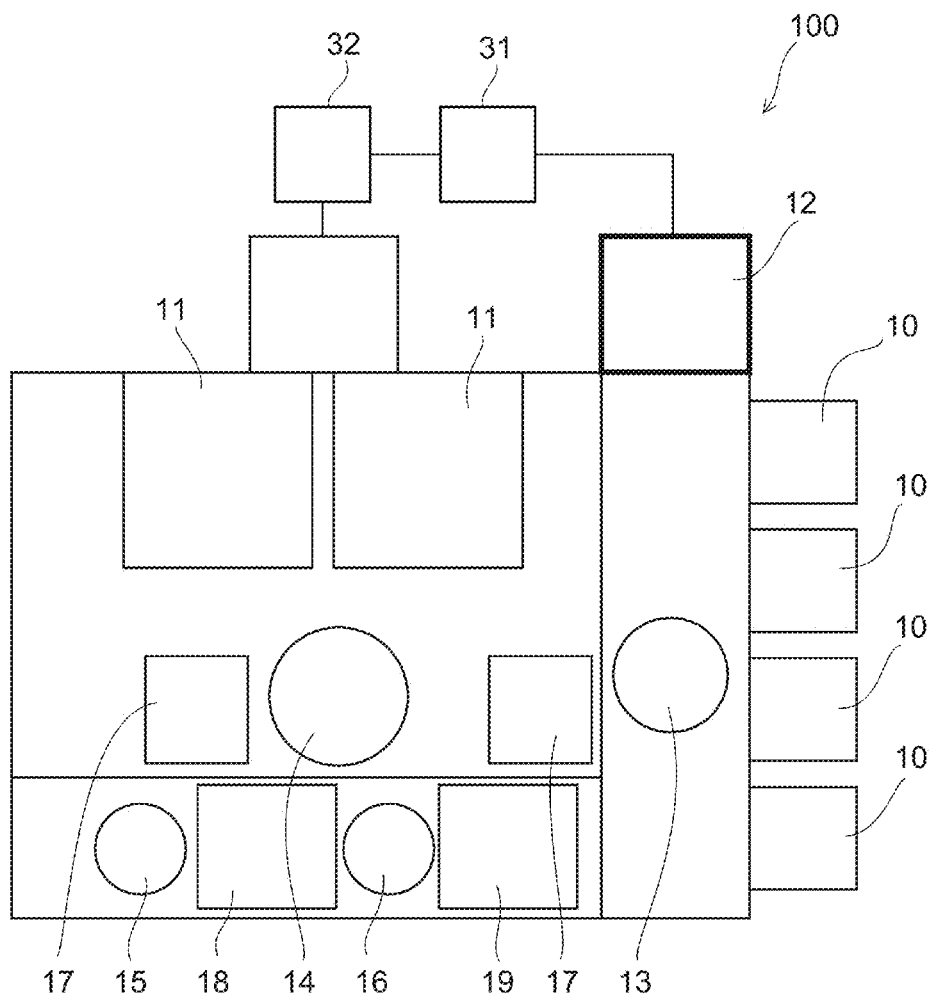
FIG. 1 is a schematic view illustrating a configuration of a polishing device according to a first embodiment.

FIG. 1 is a schematic view illustrating a configuration of a polishing device according to the first embodiment.

As shown in FIG. 1, a polishing device 100 according to this embodiment is provided with a load port 10, a polishing module 11, an inspection module 12, movement modules 13, 14, 15, and 16, a wafer station 17, a cleaning module 18, a drying module 19, a calculator 31, and a controller 32.

The load port 10 is a module for inserting a wafer into the polishing device 100. In addition, the load port 10 is also provided with a function of taking out wafers subjected to a polishing process from inside the polishing device 100. A film is formed on the wafer inserted into the polishing device 100 through the load port 10. The polishing module 11 is a module for polishing the film formed on the circumferential edge portion of the wafer. The inspection module 12 is a module for inspecting the polishing state of the wafer. The polishing state refers to, for example, a state where there is or is not a residual portion of the film on the circumferential edge portion of the wafer, or the like. The movement module 13 is a module for moving the wafer between the load port 10 and the wafer station 17. In addition, the movement module 13 moves the wafer between the wafer station 17 and the inspection module 12. The movement module 14 is a module for moving the wafer between the wafer station 17 and the polishing module 11. The movement module 15 is a module for moving the wafer between the wafer station 17 and the cleaning module 18. The movement module 16 is a module for moving the wafer between the wafer station 17 and the drying module 19. Each of the movement modules 13, 14, 15, and 16 is provided with, for example, a wafer transport mechanism such as a robot hand. The wafer station 17 is a mounting platform on which the wafer is temporarily placed. The cleaning module 18 is a module for cleaning the wafer subjected to a polishing process. The cleaning module 18 is, for example, a wafer cleaning machine such as a roll sponge type cleaning machine. The drying module 19 is a module for drying the wafer after cleaning. The drying module 19 is, for example, a wafer drying machine such as spin dryer type drying machine. The calculator 31 is a module for processing inspection data acquired by the inspection module 12 and the controller 32 is a module for controlling the polishing module 11 based on the inspection data processed by the calculator 31. The calculator 31 and the controller 32 are connected with the polishing module 11 and the inspection module 12.

Next, description will be given of the configuration of the polishing module 11 of the embodiment.

Figure 2:
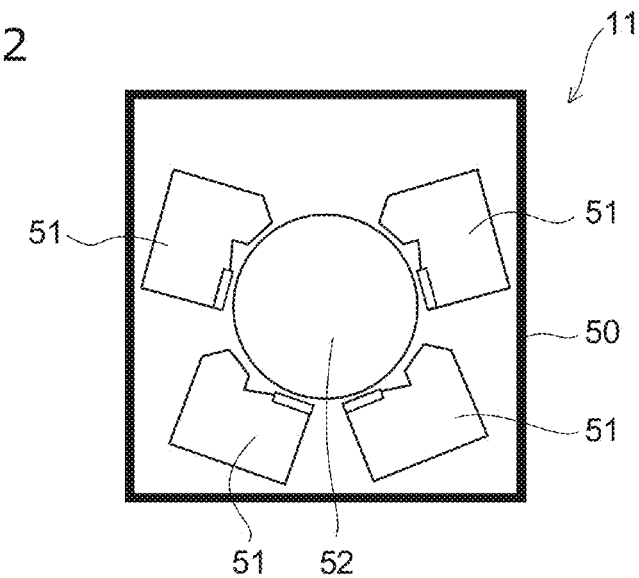
FIG. 2 is a schematic view illustrating a configuration of the polishing module in the polishing device according to the first embodiment.

FIG. 2 is a schematic view illustrating a configuration of the polishing module in the polishing device according to the embodiment.

Figure 3:
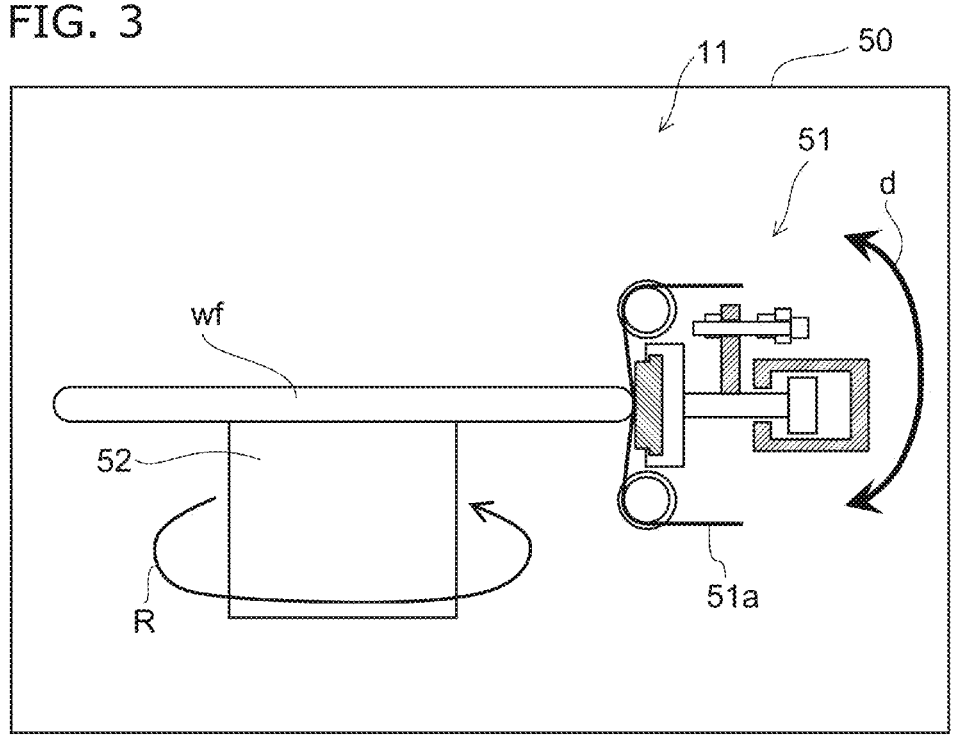
FIG. 3 is a schematic view illustrating a stage and a polishing unit in the polishing module of the polishing device according to the first embodiment.

FIG. 3 is a schematic view illustrating a stage and a polishing unit in the polishing module of the polishing device according to the embodiment.

As shown in FIG. 2, the polishing module 11 is provided with a polishing unit 51 which polishes the film formed on the circumferential edge portion of the wafer and a stage 52 on which the wafer is set. The polishing unit 51 and the stage 52 are installed inside a chamber 50. FIG. 2 shows a case where a plurality of the polishing units 51 is provided inside the chamber 50; however, there may be only one of the polishing units 51.

In addition, as shown in FIG. 3, the stage 52 is provided with a rotation mechanism which rotates a wafer wf in the circumferential direction while holding the wafer wf which is the polishing target. The stage 52, for example, rotates in the direction of the arrow R. In the polishing, a polishing tape 51a of the polishing unit 51 is in contact with the circumferential edge portion of the wafer wf. The polishing unit 51 is provided with a movable mechanism for adjusting the contact position between the polishing tape 51a and the wafer wf to a predetermined position on the circumferential edge portion of the wafer wf. The polishing unit 51 can move along the surface of the circumferential edge portion in accordance with the position of the polishing location on the circumferential edge portion of the wafer wf. For example, the polishing unit 51 can move in a direction which intersects with the major surface of the wafer wf, that is, a direction d in which the surface of the wafer wf and the rear surface are joined. Due to this, the polishing module 11 can selectively polish predetermined locations on the circumferential edge portion of the wafer wf. In addition, the polishing module 11 may be provided with nozzles from which an abrasive liquid for the polishing is discharged. In such a case, the abrasive liquid for the polishing is discharged toward the wafer wf during the polishing.

Next, description will be given of the inspection module 12 of the polishing device 100 according to the embodiment.

Figure 4:
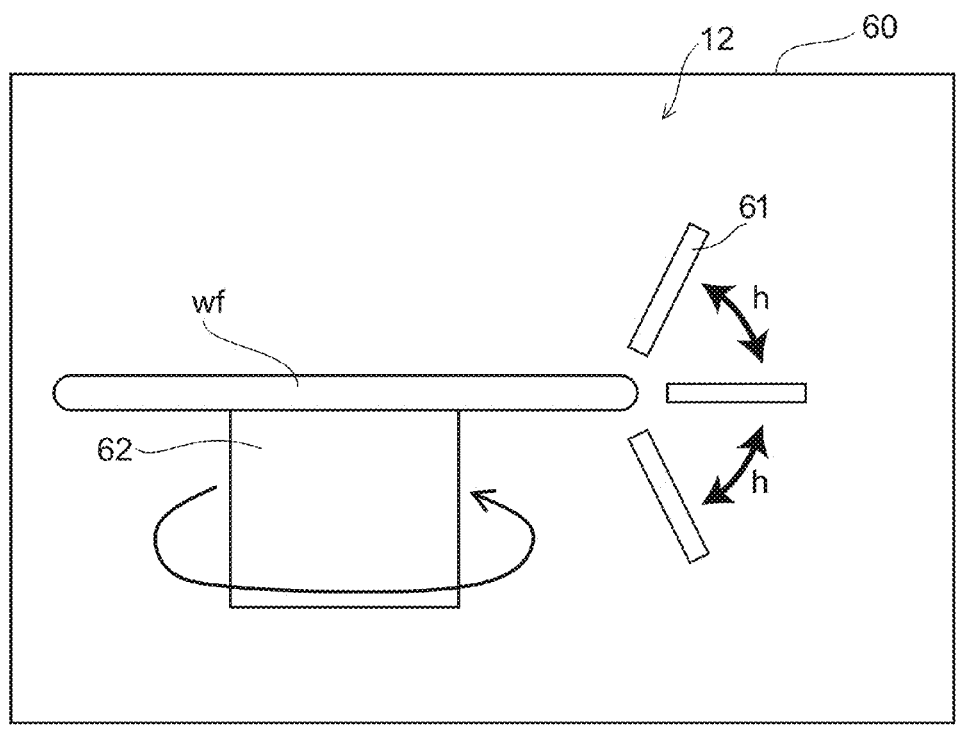
FIG. 4 is a schematic view illustrating a stage and a detector in the inspection module of the polishing device according to the first embodiment.

FIG. 4 is a schematic view illustrating a stage and a detector in the inspection module of the polishing device according to the embodiment.

As shown in FIG. 4, the inspection module 12 is provided with a detector 61 and a stage 62. The inspection module 12 is installed inside the chamber 60. In other words, the polishing module 11 and the inspection module 12 are each provided inside separate chambers. The wafer wf after the polishing process is set on the stage 62. The detector 61 is installed at a position where it is possible to inspect the state of the circumferential edge portion of the set wafer wf. In addition, a movable mechanism for moving the detector 61 according to the shape of circumferential edge portion is provided in order for the detector 61 to inspect the entirety of the circumferential edge portion of the wafer wf. Due to this, the detector 61 can move along the surface of the circumferential edge portion. For example, a detector 61 can move in a direction h which intersects with the major surface of the wafer wf. The detector 61 detects a residual portion of the film on the circumferential edge portion of the wafer wf held on the stage 62.

Next, description will be given of the operation of the polishing device 100 according to the embodiment, that is, of the method for polishing a film fm formed on the circumferential edge portion of the wafer wf.

First, description will be given of the polishing process of the wafer wf.

Figure 5A:
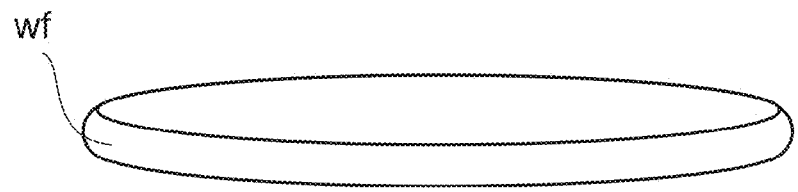
FIG. 5A is a schematic view illustrating a wafer.
Figure 5B:
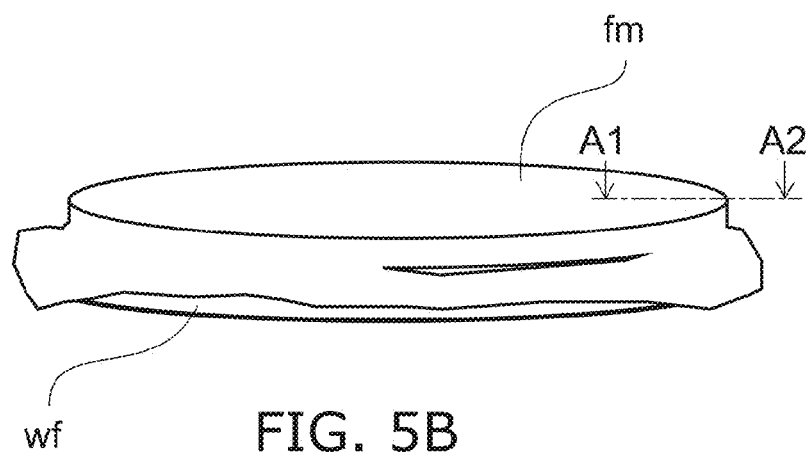
FIG. 5B is a schematic view illustrating a wafer on the upper surface of which a film is formed.
Figure 5C:
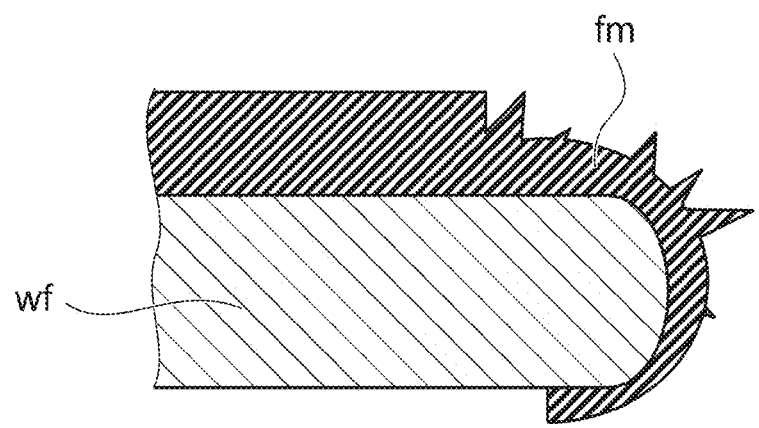
FIG. 5C is a cross-sectional view illustrating a cross-section taken along a line A1-A2 in FIG. 5B.

FIG. 5A is a schematic view illustrating a wafer, FIG. 5B is a schematic view illustrating a wafer on the upper surface of which a film is formed, and FIG. 5C is a cross-sectional view illustrating a cross-section taken along a line A1-A2 in FIG. 5B.

As shown in FIG. 5A, the shape of the wafer wf is, for example, a disc shape. The cross-section of the circumferential edge portion of the wafer wf is rounded.

As shown in FIG. 5B and FIG. 5C, the film fm is formed on the wafer wf. At this time, the film fm on the major surface of the wafer wf may be processed into a predetermined shape. In such a case, the film fm formed on the circumferential edge portion of the wafer wf includes deposited matter or the like generated by a process of processing the film fm. In a case where the film fm is a laminated film in which a plurality of films is laminated, the film fm formed on the circumferential edge portion of the wafer wf is thickened.

The shape of the film fm formed on the circumferential edge portion of the wafer wf is, for example, an irregular shape with concavities and convexities. There is a possibility the film fm formed on the circumferential edge portion of the wafer wf will contaminate the top of the major surface of the wafer wf in subsequent processes.

Figure 6A:
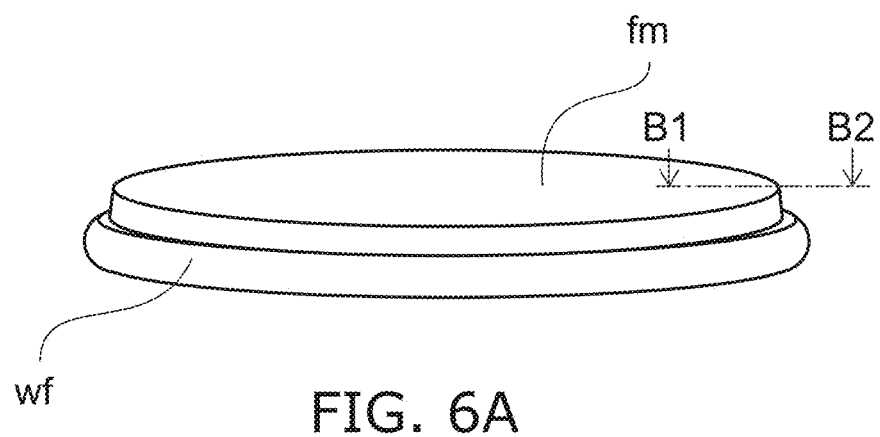
FIG. 6A is a schematic view illustrating the wafer after the polishing process and FIG. 6B is a cross-sectional view illustrating a cross-section taken along a line B1-B2 in FIG. 6A.
Figure 6B:
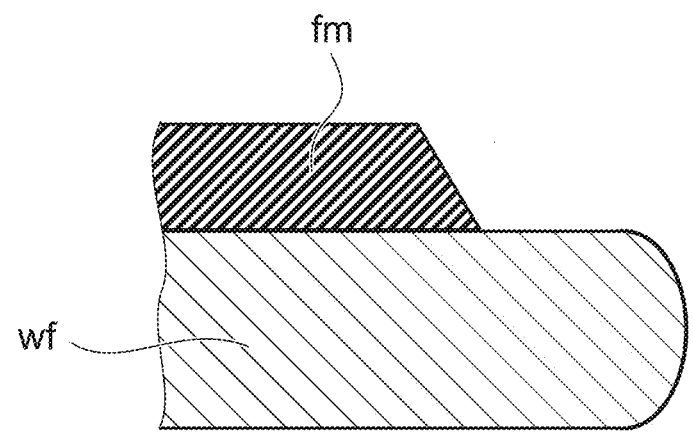

FIG. 6A is a schematic view illustrating the wafer after the polishing process and FIG. 6B is a cross-sectional view illustrating a cross-section taken along a line B1-B2 in FIG. 6A.

As shown in FIG. 6A and FIG. 6B, the film fm is removed from the circumferential edge portion of the wafer wf by the polishing process. The film fm may remain on the circumferential edge portion of the wafer wf after the polishing process. In such a case, the wafer wf is preferably polished again.

Figure 7:
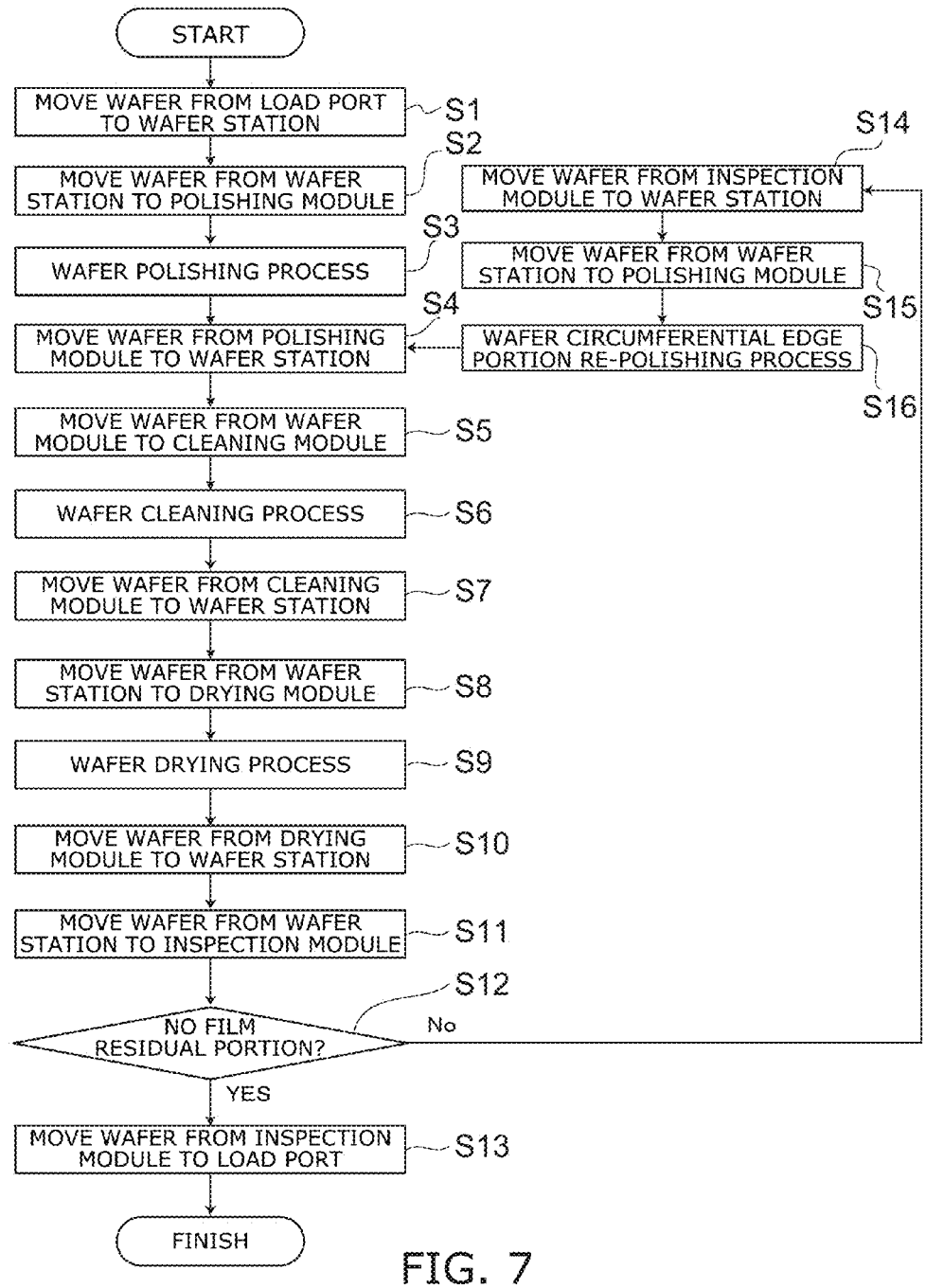
FIG. 7 is a flowchart showing the polishing method of the polishing device according to the embodiment.

FIG. 7 is a flowchart showing the polishing method of the polishing device according to the embodiment.

In the polishing method of the polishing device according to the embodiment, first, as shown in step S1, the wafer wf mounted on the load port 10 is moved to the wafer station 17 by the movement module 13. The film fm is formed on the major surface and the circumferential edge portion of the wafer wf.

Next, as shown in step S2, the wafer wf is moved from the wafer station 17 to the polishing module 11 by the movement module 14.

Next, as shown in step S3, the film fm formed on the circumferential edge portion of the wafer wf is polished by the polishing module 11 under predetermined conditions.

Next, as shown in step S4, after the polishing process, the wafer wf is moved from the polishing module 11 to the wafer station 17 by the movement module 14.

Next, as shown in step S5, after the polishing process, the wafer wf is moved from the wafer station 17 to the cleaning module 18 by the movement module 15.

Next, as shown in step S6, the wafer wf is cleaned by the cleaning module 18.

Next, as shown in step S7, after the cleaning, the wafer wf is moved from the cleaning module 18 to the wafer station 17 by the movement module 15.

Next, as shown in step S8, the wafer wf is moved from the wafer station 17 to the drying module 19 by the movement module 16.

Next, as shown in step S9, the wafer wf is dried by the drying module 19.

Next, as shown in step S10, after the drying process, the wafer wf is moved from the drying module 19 to the wafer station 17 by the movement module 16.

Next, as shown in step S11, the wafer wf is moved from the wafer station 17 to the inspection module 12 by the movement module 13.

Next, as shown in step S12, the presence or absence of residue of the film fm on the circumferential edge portion of the wafer wf is inspected by the inspection module 12. The inspection module 12 images the circumferential edge portion of the wafer wf with the camera of the detector 61 and acquires inspection data. The detector 61 images the circumferential edge portion while moving along the surface of the circumferential edge portion of the wafer wf. For example, the detector 61 can move in the direction h which intersects with the major surface of the wafer wf as shown in FIG. 4. Thereafter, the inspection data is processed as numerical value data for the brightness or the like by the calculator 31.

Then, in a case where residue of the film fm is not detected on the circumferential edge portion of the wafer wf as a result of analysis by the calculator 31, the process proceeds to process S13, the inspected wafer wf is moved from the inspection module 12 to the load port 10 by the movement module 13, and the wafer wf is taken out from the polishing device 100.

On the other hand, in a case where residue of the film fm is detected on the circumferential edge portion of the wafer wf by the inspection module 12, the process proceeds to process S14 and the wafer wf is moved from the inspection module 12 to the wafer station 17 by the movement module 13. Then, as shown in process S15, the wafer wf is moved from the wafer station 17 to the polishing module 11 by the movement module 14.

In addition, the numerical value data analyzed by the calculator 31 is sent to the controller 32.

As shown in process S16, the controller 32 controls the polishing unit 51 based on the analysis results sent from the calculator 31. Under the control of the controller 32, the polishing unit 51 moves to a position where the polishing tape 51a selectively contacts the residual portion of the film fm. Then, the wafer wf is re-polished. Due to this, the residual portion of the film fm is selectively removed from the top of the circumferential edge portion of the wafer wf.

After the re-polishing process, the wafer wf is cleaned by the cleaning module 18 and dried by the drying module 19 similarly to the processes shown in processes S4 to S12 after the polishing process described above. Thereafter, the polishing state is inspected by the inspection module 12. At this time, in a case where residue of the film fm is detected, the wafer wf is re-polished again. In addition, in a case where residue of the film fm is not detected, the wafer wf is moved to the load port 10 and taken out from the polishing device 100.

Next, description will be given of the inspection data acquired by the detector 61 and the numerical value data analyzed by the calculator 31.

FIG. 8A is a schematic view illustrating the circumferential edge portion of the wafer on which the film remains, FIG. 8B is a diagram schematically showing a photo of the circumferential edge portion of the wafer illustrated in FIG. 8A imaged by a camera of the detector, FIG. 8C is a graph showing the distribution of the brightness in the circumferential edge portion with the brightness on the horizontal axis and the position on the circumferential edge portion on the vertical axis, FIG. 8D is a schematic view illustrating the circumferential edge portion of the wafer after the re-polishing process, FIG. 8E is a diagram schematically showing a photo of the circumferential edge portion of the wafer illustrated in FIG. 8D imaged by a camera of the detector, and FIG. 8F is a graph illustrating the distribution of the brightness in the circumferential edge portion after the re-polishing process with the brightness on the horizontal axis and the position on the circumferential edge portion on the vertical axis.

For convenience of explanation, in FIG. 8A to FIG. 8F, three regions of three equal portions are set in the cross-section of the circumferential edge portion of the wafer wf from the lower surface to the upper surface of the wafer wf. Each of the regions is set as a bottom region bt, a middle region md, and a top region tp in order from the lower surface side of the wafer wf.

As shown in FIG. 8A, the film fm remains in the bottom region bt of the circumferential edge portion of the wafer wf. The detector 61 images the circumferential edge portion of the wafer wf, for example, from the direction of the arrow f. As shown in FIG. 8B, in a case where the detector 61 images a cross-section of the wafer wf where the film fm remains in the bottom region bt on the circumferential edge portion from the direction of the arrow f shown in FIG. 8A, a portion with low brightness is measured in the bottom region bt. In other words, the residual portion of the film fm is detected as a portion with low brightness in comparison with the circumferential edge portion of the wafer wf exposed without residue of the film fm. Thereafter, the inspection data is sent to the calculator 31 and analyzed. For example, as shown in FIG. 8C, the inspection data in the bottom region bt where the film fm remains is analyzed as having a numerical value lower than a predetermined threshold determined in advance.

Next, the residual portion of the film fm of the wafer wf is selectively removed by the re-polishing process.

As shown in FIG. 8D, in the circumferential edge portion of the wafer wf after the re-polishing process, the residual portion of the film fm is removed by the re-polishing process. In a case where the detector 61 images a cross-section of the wafer wf from the direction of the arrow f shown in FIG. 8D, the brightness of the bottom region bt is increased in comparison with that before the re-polishing process as shown in FIG. 8E. In other words, the removal of the residual portion of the film fm on the circumferential edge portion of the wafer wf by the re-polishing is measured as an increase in the brightness of the bottom region bt of the wafer wf. The inspection data acquired by the detector 61 is analyzed as numerical value data by the calculator 31. As shown in FIG. 8E, the inspection data of the bottom region bt where the residual portion of the film fm is removed by being re-polished is analyzed as a numerical value which is higher than a predetermined threshold by the calculator 31.

Next, the effects of the embodiment will be described.

In the polishing device 100 according to the embodiment, the polishing unit 51 which polishes the film fm formed on the circumferential edge portion of the wafer wf has a movable mechanism. Due to this, it is possible to selectively polish a predetermined position on the circumferential edge portion of the wafer wf.

In addition, in the polishing device 100 according to the embodiment is provided with the detector 61 which is able to specify the residual portion of the film fm. Due to this, it is possible to selectively polish the residual portion of the film fm using the polishing unit 51 having the movable mechanism described above. As a result, the polishing time is shortened in comparison with a case where the entirety of the circumferential edge portion of the wafer wf is polished. Accordingly, it is possible to improve the throughput.

It is also considered that it is determined whether or not the film is removed by measuring the frictional force via the stage using the fact that a frictional force generated between the wafer and the polishing unit and a frictional force generated between the film and the polishing unit are different in the polishing process and that the polishing process is to be stopped when it is determined that the film is removed from the circumferential edge portion of the wafer. However, with this method, since it is not possible to specify a position where the film remains on the circumferential edge portion of the wafer, even if the film remains in only a portion of the circumferential edge portion, the polishing of the entirety of the circumferential edge portion continues. As a result, the polishing amount of the wafer is increased and there is also a possibility of problems occurring in the subsequent processes due to the excessive polishing of the wafer.

On the other hand, with the polishing process method for selectively polishing the residual portion of the film fm on the circumferential edge portion of the wafer wf of the polishing device 100 in the embodiment, there is less change in the shape of the wafer wf since the amount of the wafer wf which is scraped off is small. This leads to fewer problems occurring in the subsequent processes due to excessive polishing of the wafer wf.

In addition, the polishing module 11 which polishes the film fm formed on the circumferential edge portion of the wafer wf and the inspection module 12 which inspects the circumferential edge portion of the wafer wf are separated into different chambers. For this reason, it is possible to inspect the circumferential edge portion of the wafer wf under conditions where there is nothing which could lead to a decrease in the inspection precision such as dust generated by the polishing of the wafer wf or an abrasive liquid for polishing. In other words, since it is possible to carry out the inspection in a clean environment, the inspection can be carried out with high precision.

Furthermore, by the detector 61 being movable, for example, it is possible to carry out inspection without influences such as reflected light due to the rounded shape of the circumferential edge portion. In other words, in a case where the circumferential edge portion is imaged from only one direction, it is considered that the brightness of only a portion is measured to be higher than the actual brightness thereof due to reflected light incident to the rounded circumferential edge portion being detected by the detector 61.

Therefore, by the detector 61 being movable and imaging the circumferential edge portion from multiple directions, the influence of reflected light is reduced and it is possible to improve the inspection precision.

(Test Example)

Description will be given below of a test example of the embodiment.

FIG. 9A is a photo of the circumferential edge portion of the wafer on which the film remains, FIG. 9B is a photo of the circumferential edge portion of the wafer shown in FIG. 9A imaged by the camera of the detector, FIG. 9C is a photo of the circumferential edge portion of the wafer imaged after the residual portion of the film was selectively polished, and FIG. 9D is a photo of the circumferential edge portion of the wafer shown in FIG. 9C imaged by the camera of the detector.

For convenience of explanation, in FIG. 9A to FIG. 9D, three regions of three equal portions are set in the cross-section of the circumferential edge portion of the wafer wf from the lower surface to the upper surface of the wafer wf. Each of the regions is set as a bottom region bt, a middle region md, and a top region tp in order from the lower surface side of the wafer wf.

As shown in FIG. 9A, the cross-section of the circumferential edge portion of the wafer wf has a rounded shape. The detector 61 imaged the circumferential edge portion of the wafer wf from the direction of the arrow g.

As shown in FIG. 9B, in a case where the cross-section of the wafer wf where the film fm which remained on the circumferential edge portion was imaged by the detector 61 from the direction of the arrow g shown in FIG. 9A, a portion where the brightness was low was detected. In such a case, the portion with high brightness was a portion with no residue of the film fm and the portion with a low brightness was a portion where the film fm remains. In the case shown in FIG. 9B, the brightness of the bottom region bt was lower in comparison with other regions. That is, the residual film fm was detected in the bottom region.

The wafer wf was moved to the polishing module 11 and the residual portion of the film fm in the bottom region bt was selectively re-polished.

Thereafter, the wafer wf after the re-polishing process was inspected by the inspection module 12. When the wafer wf was inspected by the detector 61, as shown in FIG. 9D, the brightness of the bottom region bt was increased in comparison with the bottom region bt before the additional polishing. That is, it was detected that the residual portion of the film fm in the bottom region bt was removed by the polishing.

Figure 10A:
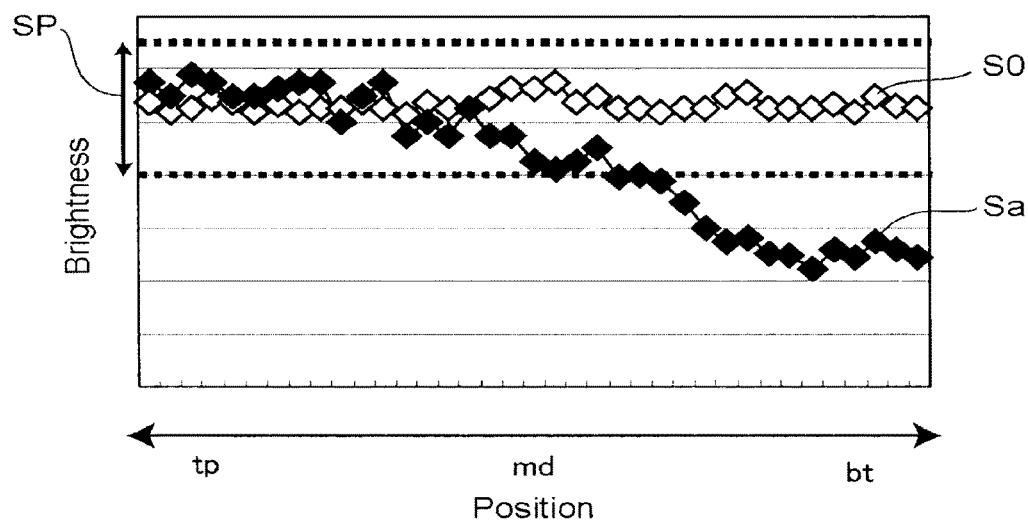
FIG. 10A and FIG. 10B are graphs showing the distribution of the brightness in the circumferential edge portion before and after the re-polishing process with the position on the circumferential edge portion on the horizontal axis and the brightness on the vertical axis.
Figure 10B:
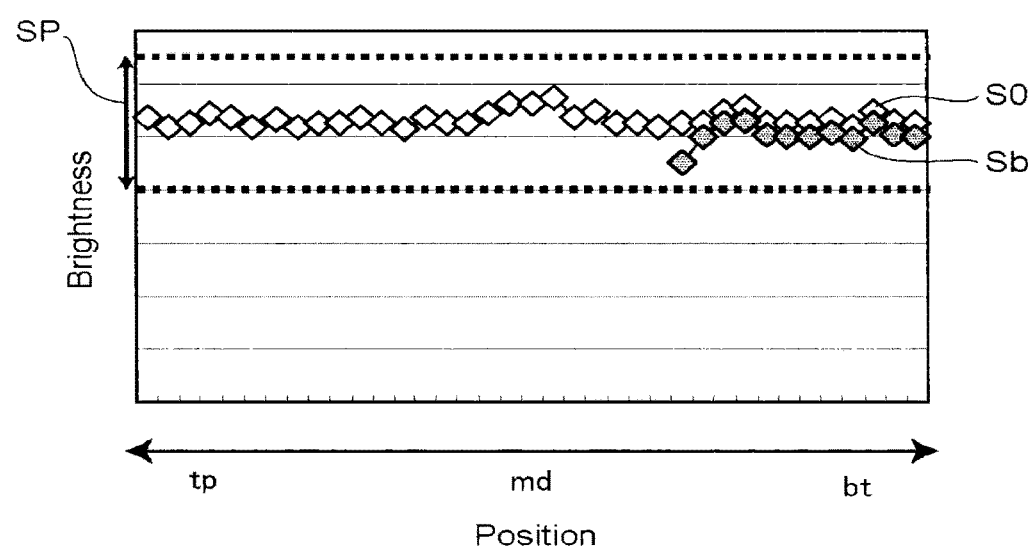

FIG. 10A and FIG. 10B are graphs illustrating the distribution of the brightness in the circumferential edge portion before and after the re-polishing process with the position on the circumferential edge portion on the horizontal axis and the brightness on the vertical axis. FIG. 10A is a graph illustrating the distribution of the brightness of the wafer before the additional polishing process, and FIG. 10B is a graph illustrating the distribution of the brightness of the wafer after the additional polishing process.

The spectrum S0 shown in FIG. 10A and FIG. 10B is a spectrum showing the brightness of the wafer wf where the film fm is not formed. In addition, a range SP is the range of the brightness in which it can be estimated that there is no residue of the film fm on the circumferential edge portion of the wafer wf. The brightness of the residual portion of the film on the circumferential edge portion of the wafer wf is detected as lower than the brightness of the portion where there is no residue of the film. In other words, a case where the brightness of the wafer wf is in the range SP or less indicates that the film fm remains.

As shown in FIG. 10A, in the spectrum Sa showing the brightness of the circumferential edge portion in the wafer wf where the film fm remains, a brightness which is outside of the range SP was measured in the bottom region bt. That is, the residual film fm was detected in the bottom region bt.

Additional polishing was carried out in order to selectively remove the residual portion of the film fm in the bottom region bt of the wafer wf. As shown in FIG. 10B, in the spectrum Sb showing the brightness of the bottom region bt in the wafer wf after the additional polishing, the brightness in the bottom region bt is a value within the range SP. That is, it was detected that the residual portion of the film fm was polished by the additional polishing.

(Second Embodiment)

Next, a second embodiment will be described.

Figure 11:
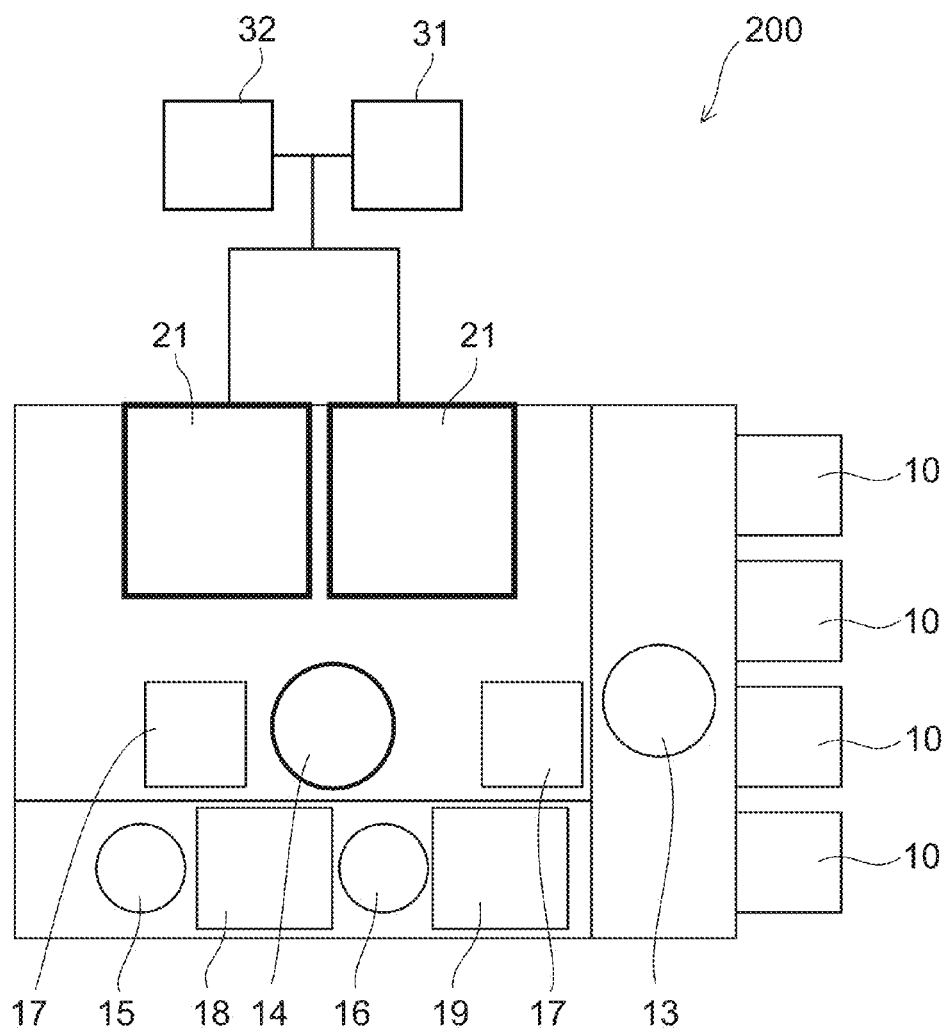
FIG. 11 is a schematic view illustrating a configuration of a polishing device according to a second embodiment.

FIG. 11 is a schematic view illustrating a configuration of a polishing device according to the embodiment.

Figure 12:
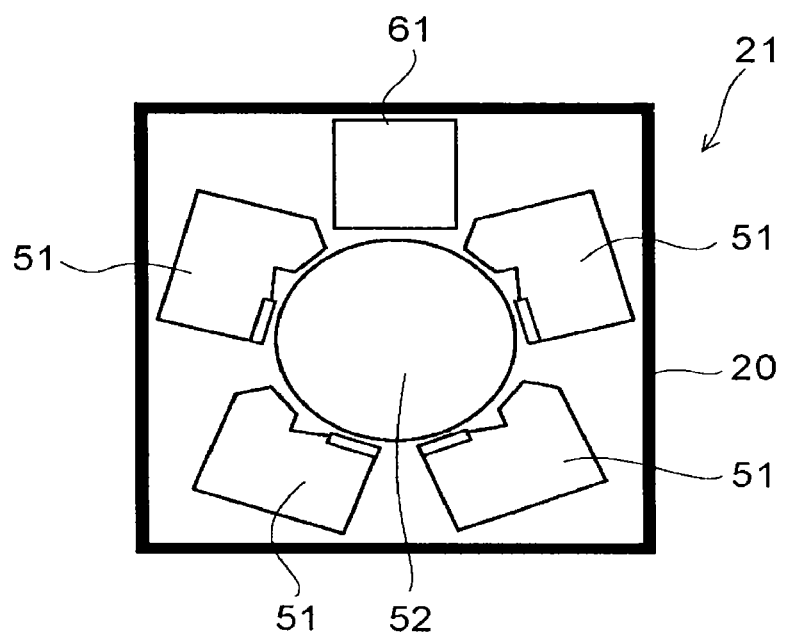
FIG. 12 is a schematic view illustrating a configuration of a composite module of the polishing device according to the second embodiment.

FIG. 12 is a schematic view illustrating a configuration of a composite module of the polishing device according to the embodiment.

As shown in FIG. 11, the polishing device 200 according to this embodiment is provided with the load port 10, the composite module 21, the movement module 13, the movement module 14, the movement module 15, the movement module 16, the wafer station 17, the cleaning module 18, the drying module 19, the calculator 31, and the controller 32.

As shown in FIG. 12, the composite module 21 is provided with the polishing unit 51, the stage 52, and the detector 61. In addition, the composite module 21 may be provided with a nozzle from which the abrasive liquid for polishing is discharged. The composite module 21 is provided inside the chamber 20. In addition, the calculator 31 and the controller 32 are connected with the composite module 21.

The configuration of the polishing device 200 according to the embodiment is the same as the polishing device 100 according to the first embodiment except that the polishing module 11 and the inspection module 12 are not provided, the composite module 21 is provided, and the calculator 31 and the controller 32 are connected with the composite module 21.

In the embodiment, the movement module 13 is a module for moving the wafer inserted from the load port 10 to the wafer station 17. The movement module 14 is a module for moving the wafer between the wafer station 17 and the composite module 21.

In the embodiment, the polishing process of the wafer wf and the inspection of the circumferential edge portion of the wafer wf are carried out inside the chamber 20. The inspection of the circumferential edge portion may be carried out while carrying out the polishing process on the wafer wf. In addition, the detector 61 may detect the state of the circumferential edge portion while moving according to the shape of the circumferential edge portion of the wafer wf.

Next, the effects of the embodiment will be described.

In the polishing device 200 according to the embodiment, the polishing process of the wafer wf and the inspection of the circumferential edge portion can be carried out inside the same chamber 20. For this reason, the polishing process and the inspection of the circumferential edge portion can be carried out without moving between chambers. Accordingly, this leads to an improvement in the throughput.

In addition, since it is possible to carry out the inspection of the circumferential edge portion while carrying out the polishing process on the wafer wf, this leads to the time for the polishing process being shortened.

Furthermore, similarly to the first embodiment, the polishing unit 51 which polishes the film fm formed on the circumferential edge portion of the wafer wf has a movable mechanism. Due to this, it is possible to selectively polish a predetermined position on the circumferential edge portion of the wafer wf.

Furthermore, the detector 61 which is able to specify the residue of the film fm on the circumferential edge portion is provided, similarly to the first embodiment. Due to this, it is possible to selectively polish the residual portion of the film fm using the polishing unit 51 having the movable mechanism. As a result, since the entirety of the circumferential edge portion of the wafer wf is not polished, the polishing time is shortened and it is possible to achieve an improvement in the throughput.

Furthermore, similarly to the first embodiment, with the polishing process method for selectively polishing the residual portion in the polishing device 200 in the embodiment, there is less change in the shape of the wafer wf since the amount of the wafer wf which is scraped off is small. This leads to fewer problems occurring in the subsequent processes due to excessive polishing of the wafer wf.

(Third Embodiment)

Next, a third embodiment will be described.

Figure 13:
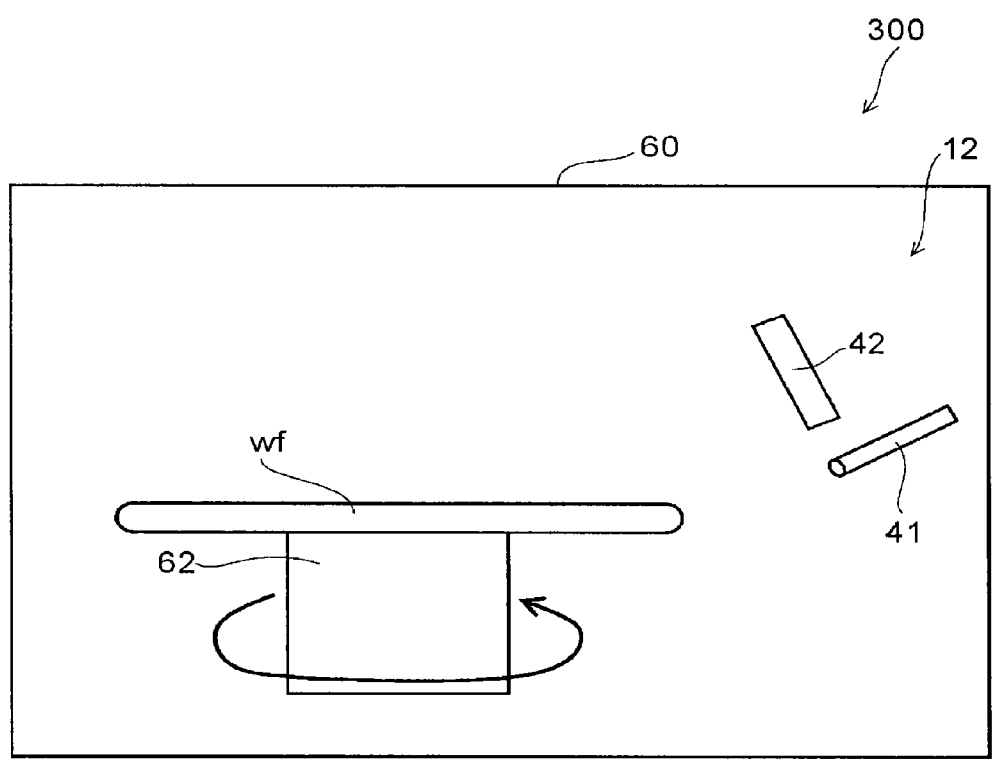
FIG. 13 is a schematic view illustrating a configuration of an inspection module in the polishing device according to a third embodiment.

FIG. 13 is a schematic view illustrating a configuration of an inspection module in the polishing device according to the embodiment.

In the inspection module 12 of the polishing device 300 according to the embodiment, an irradiation part 41 which irradiates the circumferential edge portion of the wafer wf with laser light and the detector 42 which detects reflected light reflected by the circumferential edge portion are provided as illustrated in FIG. 13. A movable mechanism is provided in the detector 42.

In the polishing device 300 according to the embodiment, the residual portion of the film fm in the circumferential edge portion is detected by detecting the reflected light of the laser light reflected by the circumferential edge portion with the detector 42.

The polishing device 300 according to the embodiment is the same as the first embodiment except that the irradiation part 41 and the detector 42 are provided in the inspection module 12 instead of the detector 61.

Next, the effects of the embodiment will be described.

According to the embodiment, similarly to the first embodiment, it is possible to selectively polish predetermined positions on the circumferential edge portion of the wafer wf using the polishing unit 51 having a movable mechanism.

In addition, the polishing device 300 according to the embodiment can detect the residue of the film fm by irradiating the circumferential edge portion with laser light using the irradiation part 41 and detecting the reflected light reflected by the circumferential edge portion with the detector 42. Due to this, it is possible to selectively polish the residual portion of the film fm using the polishing unit 51 having the movable mechanism described above. As a result, since the entirety of the circumferential edge portion of the wafer wf is not polished, the polishing time is shortened and it is possible to achieve an improvement in the throughput.

Furthermore, similarly to the first embodiment, the polishing device 300 in the embodiment selectively polishes the residual portion of the film fm on the circumferential edge portion. Due to this, there is less change in the shape of the wafer wf since the amount of the wafer wf which is scraped off is small. This leads to fewer problems occurring in the subsequent processes due to excessive polishing of the wafer wf.

Furthermore, the polishing module 11 and the inspection module 12 are separated into different chambers, similarly to the first embodiment. For this reason, since the inspection can be carried out in a clean environment, it is possible to carry out the inspection with high precision.

(Fourth Embodiment)

Next, a fourth embodiment will be described.

Figure 14:
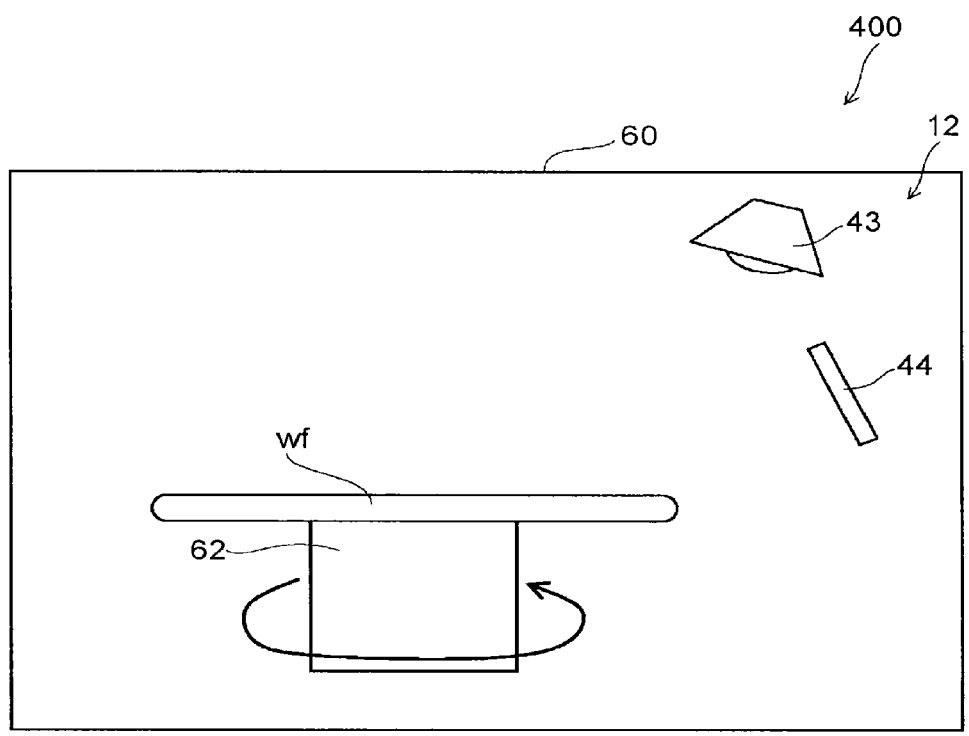
FIG. 14 is a schematic view illustrating a configuration of an inspection module in the polishing device according to a fourth embodiment.

FIG. 14 is a schematic view illustrating a configuration of an inspection module in the polishing device according to the embodiment.

As shown in FIG. 14, an irradiation part 43 which irradiates the circumferential edge portion of the wafer wf with white light and a detector 44 which detects the reflected light reflected by the circumferential edge portion are provided in the inspection module 12 of the polishing device 400 according to the embodiment. The irradiation part 43 and the detector 44 are provided with a movable mechanism, respectively.

The polishing device 400 according to the embodiment detects the residue of the film fm on the circumferential edge portion by detecting the white light reflected by the circumferential edge portion using the detector 44. In other words, the detector 44 specifies the residual portion of the film fm on the circumferential edge portion by detecting differences in the reflectivity between the wafer wf and the film fm.

The polishing device 400 according to the embodiment is the same as the first embodiment except that the irradiation part 43 and the detector 44 are provided instead of the detector 61.

Next, the effects of the embodiment will be described.

According to the embodiment, similarly to the first embodiment, it is possible to selectively polish predetermined positions on the circumferential edge portion of the wafer wf using the polishing unit 51 having a movable mechanism.

In addition, the polishing device 400 according to the embodiment is able to specify the residual portion of the film fm by irradiating the circumferential edge portion with white light using the irradiation part 43 and detecting the reflected light reflected by the circumferential edge portion with the detector 44. Due to this, it is possible to selectively polish the residual portion of the film fm using the polishing unit 51 having the movable mechanism described above. As a result, since the entirety of the circumferential edge portion of the wafer wf is not polished, the polishing time is shortened and it is possible to achieve an improvement in the throughput.

Furthermore, by the irradiation part 43 and the detector 44 being movable, for example, it is possible to carry out inspection without influences such as reflected light due to the rounded shape of the circumferential edge portion. In other words, even when the white light is reflected in a specific direction due to the rounded shape of the circumferential edge portion, since the irradiation part 43 and the detector 44 are able to move and inspect the circumferential edge portion from multiple directions, it is possible to reduce the influence of the reflected light or the like due to the shape of the circumferential edge portion. Due to this, it is possible to carry out the inspection with high precision.

Furthermore, similarly to the first embodiment, with the polishing process method for selectively polishing the residual portion of the film fm in the polishing device 400 according to the embodiment, there is less change in the shape of the wafer wf since the amount of the wafer wf which is scraped off is small. This leads to fewer problems occurring in the subsequent processes due to excessive polishing of the wafer wf.

Furthermore, the polishing module 11 and the inspection module 12 are separated into different chambers, similarly to the first embodiment. For this reason, since the inspection can be carried out in a clean environment, it is possible to carry out the inspection with high precision.

(Fifth Embodiment)

Next, a fifth embodiment will be described.

Figure 15:
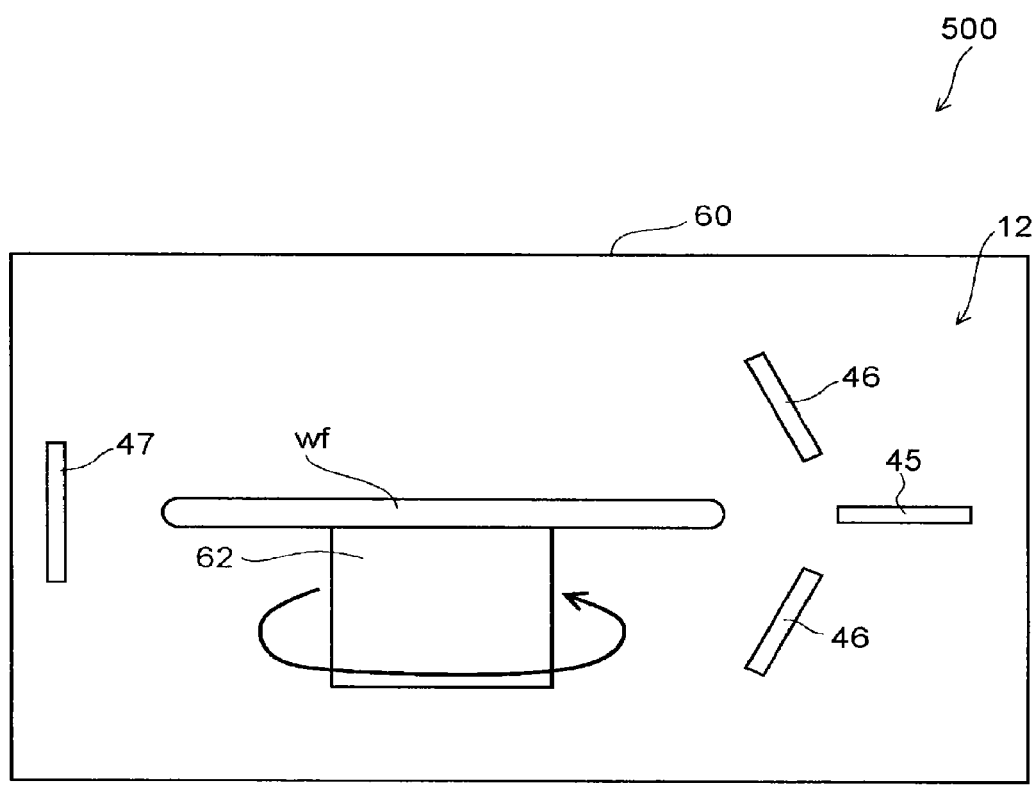
FIG. 15 is a schematic view illustrating a configuration of an inspection module in the polishing device according to a fifth embodiment.

FIG. 15 is a schematic view illustrating a configuration of an inspection module in the polishing device according to the embodiment.

In the polishing device 500 according to this embodiment, as shown in FIG. 15, an irradiation part 45 which irradiates the circumferential edge portion of the wafer wf with microwaves and a reflected wave detector 46 which detects reflected waves reflected by the circumferential edge portion are provided in the inspection module 12. A plurality of the reflected wave detectors 46 may be provided. In addition, the inspection module 12 is provided with a diffracted wave detector 47 which detects diffracted waves diffracted by the wafer wf.

The polishing device 500 according to the embodiment detects the residue of the film fm on the circumferential edge portion by detecting the reflected waves reflected by the circumferential edge portion using the reflected wave detector 46. In addition, the residue of the film fm is also detected by detecting diffracted waves diffracted by the wafer wf using the diffracted wave detector 47.

The polishing device 500 according to the embodiment is the same as the first embodiment except that the irradiation part 45, the reflected wave detector 46, and the diffracted wave detector 47 are provided instead of the detector 61.

Next, the effects of the embodiment will be described.

According to the embodiment, similarly to the first embodiment, it is possible to selectively polish predetermined positions on the circumferential edge portion of the wafer wf using the polishing unit 51 having a movable mechanism.

In addition, the polishing device 500 according to the embodiment is able to detect the residue of the film fm by irradiating the circumferential edge portion with microwaves using the irradiation part 45 and detecting the reflection waves reflected by the circumferential edge portion with the reflected wave detector 46. Alternatively, it is possible to detect the residue of the film fm by detecting diffracted waves diffracted by the wafer wf with the diffracted wave detector 47. Due to this, it is possible to selectively polish the residual portion of the film fm using the polishing unit 51 having the movable mechanism described above. As a result, since the entirety of the circumferential edge portion of the wafer wf is not polished, the polishing time is shortened and it is possible to achieve an improvement in the throughput.

Furthermore, it is possible to obtain inspection data with higher precision by combining the respective inspection data obtained by the reflected wave detector 46 and the diffracted wave detector 47.

Furthermore, similarly to the first embodiment, with the polishing process method for selectively polishing the residual portion of the film fm on the circumferential edge portion of the wafer wf in the polishing device 500 in the embodiment, there is less change in the shape of the wafer wf since the amount of the wafer wf which is scraped off is small. This leads to fewer problems occurring in the subsequent processes due to excessive polishing of the wafer wf.

Furthermore, since the polishing module 11 and the inspection module 12 are separated into different chambers, similarly to the first embodiment, the inspection can be carried out in a clean environment. Due to this, it is possible to carry out the inspection with high precision.

(Sixth Embodiment)

Next, a sixth embodiment will be described.

Figure 16:
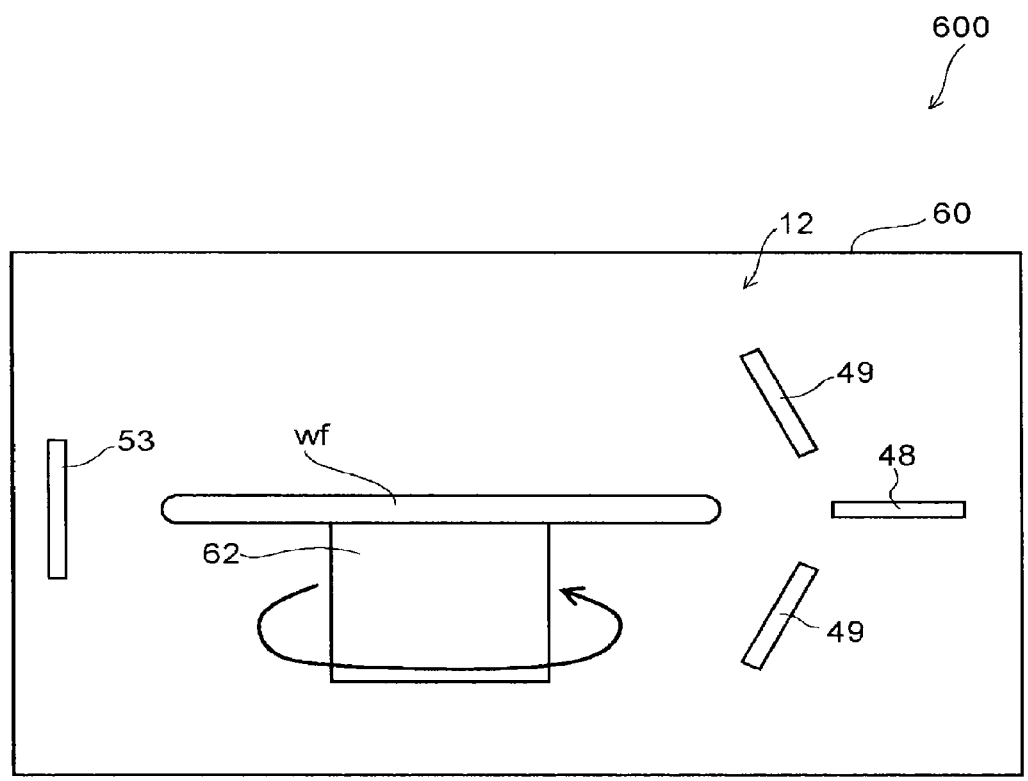
FIG. 16 is a schematic view illustrating a configuration of an inspection module in the polishing device according to this embodiment.

FIG. 16 is a schematic view illustrating a configuration of an inspection module in the polishing device according to the embodiment.

In the polishing device 600 according to the embodiment, as shown in FIG. 16, an irradiation part 48 which irradiates the circumferential edge portion of the wafer wf with ultrasonic waves and a reflected wave detector 49 which detects reflected waves reflected by the circumferential edge portion are provided in the inspection module 12. A plurality of the reflected wave detectors 49 may be provided. In addition, a diffracted wave detector 53 which detects diffracted waves diffracted by the wafer wf is provided in the inspection module 12.

The polishing device 600 according to the embodiment detects the residue of the film fm on the circumferential edge portion by detecting the reflected waves reflected by the circumferential edge portion using the reflected wave detector 49. In addition, the residue of the film fm is also detected by detecting diffracted waves diffracted by the wafer wf using the diffracted wave detector 53.

The polishing device 600 according to the embodiment is the same as the first embodiment except that the irradiation part 48, the reflected wave detector 49, and the diffracted wave detector 53 are provided instead of the detector 61.

Next, the effects of the embodiment will be described.

According to the embodiment, similarly to the first embodiment, it is possible to selectively polish predetermined positions on the circumferential edge portion of the wafer using the polishing unit 51 having the movable mechanism.

In addition, the polishing device 600 according to the embodiment detects the residue of the film fm by irradiating the circumferential edge portion with ultrasonic waves using the irradiation part 48 and detecting reflected waves reflected by the circumferential edge portion. In addition, the residue of the film fm can also be detected by detecting diffracted waves diffracted by the wafer wf using the diffracted wave detector 53. Due to this, it is possible to selectively polish the residual portion of the film fm using the polishing unit 51 having the movable mechanism described above. As a result, since the entirety of the circumferential edge portion of the wafer wf is not polished, the polishing time is shortened and it is possible to achieve an improvement in the throughput.

Furthermore, it is possible to obtain inspection data with higher precision by combining the respective inspection data obtained by the reflected wave detector 49 and the diffracted wave detector 53.

Furthermore, similarly to the first embodiment, with the polishing process method for selectively polishing the residual portion of the film fm on the circumferential edge portion of the wafer wf, there is less change in the shape of the wafer wf since the amount of the wafer wf which is scraped off is small. This leads to fewer problems occurring in the subsequent processes due to excessive polishing of the wafer wf.

Furthermore, the polishing module 11 and the inspection module 12 are separated into different chambers, similarly to the first embodiment. Due to this, the inspection can be carried out in a clean environment without dust generated in the polishing or an abrasive liquid for polishing. Due to this, it is possible to carry out the inspection with high precision.

According to these embodiments described above, it is possible to realize a polishing device for which the time for the polishing process is short.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A polishing device comprising:
   a stage configured to hold a wafer;
   a polishing part configured to polish a film formed on a circumferential edge portion of the wafer;
   a cleaner configured to clean the wafer;
   a dryer configured to dry the wafer;
   a detector configured to detect a residual portion of the film on the circumferential edge portion of the wafer and to identify a target region where the residual portion is located among regions of the circumferential edge portion of the wafer that divide the circumferential edge portion of the wafer along a direction that intersects a major surface of the wafer, the regions including at least a bottom region, a middle region, and a top region arranged from a lower surface side to an upper surface side of the wafer, the detector being configured to image the circumferential edge portion and to detect the residual portion according to brightness information of an imaged image, brightness of the residual portion in the imaged image being lower than brightness of an exposed portion of the wafer in the imaged image;

a first movable part configured to move the detector in the direction that intersects the major surface of the wafer such that the detector is movable along a surface of the circumferential edge portion of the wafer between the upper surface side and the lower surface side of the wafer; and a controller configured to control the polishing part based on a state of the circumferential edge portion detected by the detector, including causing the polishing part to perform selective re-polishing on the wafer only at the target region on the circumferential edge portion of the wafer when the detector detects the residual portion of the film on the circumferential edge portion of the wafer after the wafer is polished by the polishing part, cleaned by the cleaner, and dried by the dryer, the controller causing the polishing part to polish the film formed on the circumferential edge portion of the wafer, causing the cleaner to clean the wafer, causing the dryer to dry the wafer, causing the detector to detect the residual portion of the film on the circumferential edge portion of the wafer by acquiring the brightness information from the imaged image of the circumferential edge portion of the wafer, and by analyzing the brightness information to identify the target region among the regions including at least the bottom region, the middle region, and the top region, and causing the polishing part to perform selective re-polishing on the wafer only at the identified target region to remove the detected residual portion of the film, to be executed in this order during a period that the wafer remains inside the polishing device.

2. The device according to claim 1, further comprising a second movable part controlled by the controller and configured to move the polishing part along the direction.

3. The device according to claim 1, further comprising a rotation mechanism configured to rotate the stage.

4. The device according to claim 1, wherein the detector is configured to detect the residual portion by irradiating the circumferential edge portion with ultrasonic waves and detecting reflected waves of the ultrasonic waves from the circumferential edge portion.

5. The device according to claim 1, wherein the detector is configured to detect the residual portion by irradiating the circumferential edge portion with microwaves and detecting reflected waves of the microwaves from the circumferential edge portion.

6. The device according to claim 1, wherein the detector is configured to detect the residual portion by irradiating the circumferential edge portion with white light and detecting reflected light of the white light from the circumferential edge portion.

7. The device according to claim 1, wherein the detector is configured to detect the residual portion by irradiating the circumferential edge portion with laser light and detecting reflected light of the laser light from the circumferential edge portion.

8. The device according to claim 1, further comprising:
a first chamber,
the stage, the polishing part, and the detector being arranged inside the first chamber.

9. The device according to claim 1, further comprising:
a first chamber;
a second chamber; and
a movement module configured to move the wafer between the first chamber and the second chamber,
the polishing part being arranged inside the first chamber, and
the detector being arranged inside the second chamber.

10. A polishing method comprising:
moving a wafer from outside a polishing device to inside the polishing device via a load port;
polishing a film deposited onto a circumferential edge portion of the wafer;
cleaning the wafer after polishing the wafer;
drying the wafer after cleaning the wafer;
detecting a residual portion of the film on the circumferential edge portion after drying the wafer and identifying a target region where the residual portion is located among regions of the circumferential edge portion of the wafer that divide the circumferential edge portion of the wafer along a direction that intersects a major surface of the wafer, the regions including at least a bottom region, a middle region, and a top region arranged from a lower surface side to an upper surface side of the wafer, and the detecting the residual portion includes
    imaging an image of the circumferential edge portion of the wafer, the imaging being carried out by a detector while moving the detector in the direction that intersects the major surface of the wafer along a surface of the circumferential edge portion between the upper surface side and the lower surface side of the wafer,
    acquiring brightness information of the imaged image,
    specifying the residual portion of the film by analyzing the brightness information, brightness of the residual portion in the imaged image being lower than brightness of an exposed portion of the wafer in the imaged image, and
    identifying the target region among the regions including at least the bottom region, the middle region, and the top region; and
performing selective re-polishing on the wafer only at the identified target region when the residue portion is detected, the selective re-polishing including removing the detected residual portion of the film,
the polishing, the cleaning, the drying, the detecting, and the performing selective re-polishing being performed in this order during a period that the wafer remains inside the polishing device.

11. A polishing method comprising:
detecting a residual portion of a film deposited onto a circumferential edge portion of a wafer after the film deposited onto the circumferential edge portion of the wafer is polished and the wafer is cleaned and dried after the film is polished, the detecting the residual portion including
    imaging an image of the circumferential edge portion of the wafer, the imaging being carried out by a detector while moving the detector in a direction that intersects a major surface of the wafer along a surface of the circumferential edge portion between an upper surface side and a lower surface side of the wafer,
    acquiring brightness information of the imaged image, and specifying the residual portion of the film by analyzing the brightness information, brightness of the residual portion in the imaged image being lower than brightness of an exposed portion of the wafer in the imaged image;

identifying a target region where the residual portion is located among regions of the circumferential edge portion of the wafer that divide the circumferential edge portion of the wafer along the direction that intersects the major surface of the wafer, the regions including at least a bottom region, a middle region, and a top region arranged from the lower surface side to the upper surface side of the wafer; and performing selective polishing on the wafer only at the identified target region to remove the detected residual portion of the film.

* * * * *